United States Patent
Heilersig et al.

(10) Patent No.: US 9,282,664 B2
(45) Date of Patent: Mar. 8, 2016

(54) SWITCHING INSTALLATION WITH PRESSURE CONTROLLED SHORT-CIRCUIT DEVICE

(75) Inventors: Johan Dinant Heilersig, Markelo (NL); Paolo D'Amico, JD Arnhem (NL); Peter Hornok, MG (NL); Marcel Van Dijk, Enschede (NL)

(73) Assignee: EATON INDUSTRIES (NETHERLANDS) B.V., SC Hengelo (NL)

( * ) Notice: Subject to any disclaimer, the term of this patent is extended or adjusted under 35 U.S.C. 154(b) by 238 days.

(21) Appl. No.: 14/234,417

(22) PCT Filed: Jul. 24, 2012

(86) PCT No.: PCT/EP2012/064454
§ 371 (c)(1),
(2), (4) Date: Apr. 24, 2014

(87) PCT Pub. No.: WO2013/014135
PCT Pub. Date: Jan. 31, 2013

(65) Prior Publication Data
US 2014/0247536 A1 Sep. 4, 2014

(30) Foreign Application Priority Data
Jul. 25, 2011 (EP) .................................. 11175157

(51) Int. Cl.
*H02B 5/00* (2006.01)
*H02B 7/00* (2006.01)
*H05K 5/06* (2006.01)
*F16K 99/00* (2006.01)
(Continued)

(52) U.S. Cl.
CPC ............ *H05K 5/069* (2013.01); *F16K 99/0001* (2013.01); *F16K 99/0046* (2013.01); *H02B 13/00* (2013.01); *H02B 13/025* (2013.01); *H02B 13/065* (2013.01); *H02B 13/075* (2013.01)

(58) Field of Classification Search
CPC .............. F16K 99/001; F16K 99/0046; F16K 2099/0084; F16K 99/0034; F16K 2099/0074; F16K 2099/008; F16K 99/004; F16K 99/0048; Y10T 137/2409; Y10T 137/87917; Y10T 137/0318; Y10T 137/2202; Y10T 137/227; H02B 13/00; H02B 13/065; H02B 13/075; H02B 5/069
USPC .......................................... 361/604, 612, 618
See application file for complete search history.

(56) References Cited

U.S. PATENT DOCUMENTS 2,588,622 A * 3/1952 Eckman ................. G05B 11/50
137/85
2,588,678 A * 3/1952 Wills ...................... G01L 13/02
137/85
(Continued)

FOREIGN PATENT DOCUMENTS

DE 3131417 A1 2/1983
EP 0707364 A1 4/1996
(Continued)

*Primary Examiner* — Adam B Dravininkas
(74) *Attorney, Agent, or Firm* — Leydig, Voit & Mayer, Ltd.

(57) ABSTRACT

A switching installation includes a gas tight housing with at least one wall part. An input conductor disposed in the housing is configured to carry an input voltage. An insulation is arranged around the input conductor so as to insulate the input conductor from the housing. A short-circuit device is changeable from a first condition, in which the insulation is insulating the input conductor from the housing, to a second condition, in which an electrical short circuit connection is created through the insulation between the input conductor and an auxiliary connection. An actuator is coupled to the at least one wall part of the gas tight housing and is configured to actuate the short-circuit device as a result of movement of the wall part caused by a pressure increase in the housing. A threshold device is configured to provide a preset threshold in the actuator.

14 Claims, 4 Drawing Sheets

(51) Int. Cl.
  *H02B 13/025* (2006.01)
  *H02B 13/00* (2006.01)
  *H02B 13/065* (2006.01)
  *H02B 13/075* (2006.01)

(56) References Cited

U.S. PATENT DOCUMENTS 3,619,726 A * 11/1971 Boersma ................ H01H 33/56
  218/68
3,962,605 A * 6/1976 Thaler .................. H01H 39/004
  174/11 R
4,665,945 A * 5/1987 Suzuki .................... F17C 13/04
  137/463

FOREIGN PATENT DOCUMENTS

| FR | 2418557 A1 | 9/1979 |
| FR | 2637423 A1 | 4/1990 |
| WO | WO 2010034814 A1 | 4/2010 |

* cited by examiner

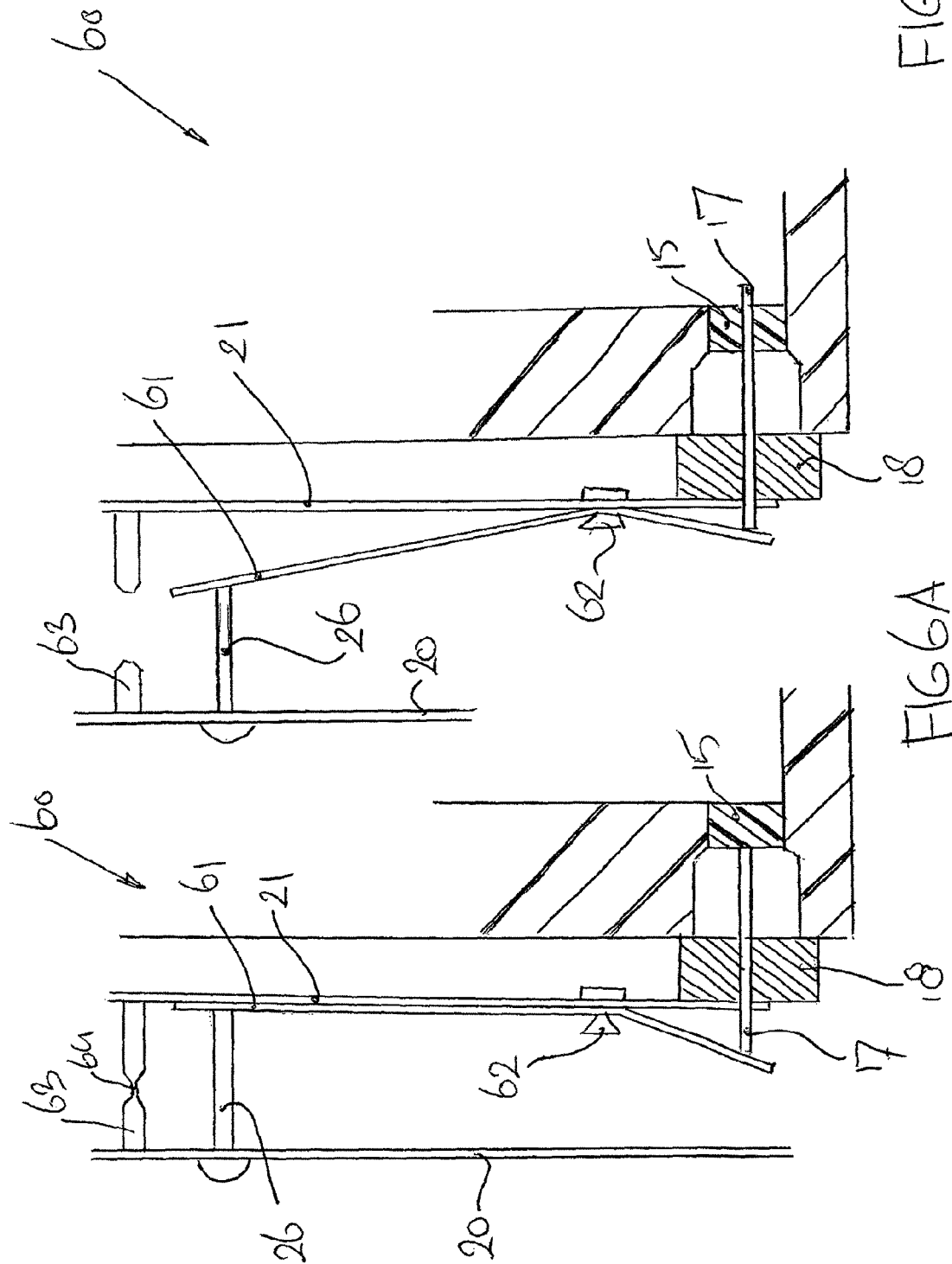

SWITCHING INSTALLATION WITH PRESSURE CONTROLLED SHORT-CIRCUIT DEVICE

CROSS-REFERENCE TO PRIOR APPLICATIONS

This application is a U.S. National Phase Application under 35 U.S.C. §371 of International Application No. PCT/EP2012/064454, filed on Jul. 24, 2012, and claims benefit to European Patent Application No. EP 11175157.4, filed on Jul. 25, 2011. The International Application was published in English on Jan. 31, 2013 as WO 2013/014135 under PCT Article 21(2).

FIELD

The invention relates to a switching installation comprising:
- a gas tight housing with at least one wall part;
- an input conductor for carrying an input voltage, the conductor being arranged in the housing;
- an insulation arranged around the input conductor to insulate the input conductor from the housing;
- a short-circuit device changeable from a first condition, in which the insulation is insulating the input conductor from the housing, to a second condition, in which an electrical short circuit connection is created through the insulation between the input conductor and an auxiliary connection; and
- an actuator coupled to the at least one wall part of the gas tight housing for actuating the short-circuit device upon movement of the wall part as a result of a pressure increase in the housing.

BACKGROUND

WO2010/034814 discloses a switching installation having a gas-filled and gastight enclosure. Inside the enclosure at least one input conductor is arranged, which carries an input voltage. This input voltage is typically in the range of medium to high voltages, i.e. 1 kV and higher. The input conductor is enveloped in a solid insulation to insulate the input conductor from the housing.

To reduce or prevent accidental internal arcing inside the housing, protection means are provided. These protection means have a short-circuit device changeable from a first condition to a second condition. In the first condition the short-circuit device is in a rest position, in which the insulation insulates the input conductor from the housing.

In this publication a solid insulation is used, but the input conductor could also be insulated by a vacuum or by other means. In the second condition, the short-circuit device creates an opening in the insulation, typically by puncturing or removing a part of the insulation, such that an electrical connection is created between the input conductor and an auxiliary connection, such as a ground point or another conducting part of the installation.

The short-circuit device is operated by a lever, which is hingedly attached to an internal frame of the switching installation and which lever is connected with a free end to a back wall of the housing. When internal arcing occurs, the pressure will rise inside of the housing, such that the back wall of the housing will bend outwardly and the connected lever will operate the short-circuit device.

SUMMARY

In an embodiment, the present invention provides a switching installation including a gas tight housing with at least one wall part. An input conductor disposed in the housing is configured to carry an input voltage. An insulation is arranged around the input conductor so as to insulate the input conductor from the housing. A short-circuit device is changeable from a first condition, in which the insulation is insulating the input conductor from the housing, to a second condition, in which an electrical short circuit connection is created through the insulation between the input conductor and an auxiliary connection. An actuator is coupled to the at least one wall part of the gas tight housing and is configured to actuate the short-circuit device as a result of movement of the wall part caused by a pressure increase in the housing. A threshold device is configured to provide a preset threshold in the actuator.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 6A and 6B show schematic views of a fifth embodiment in two conditions.

DETAILED DESCRIPTION

Figure 1:
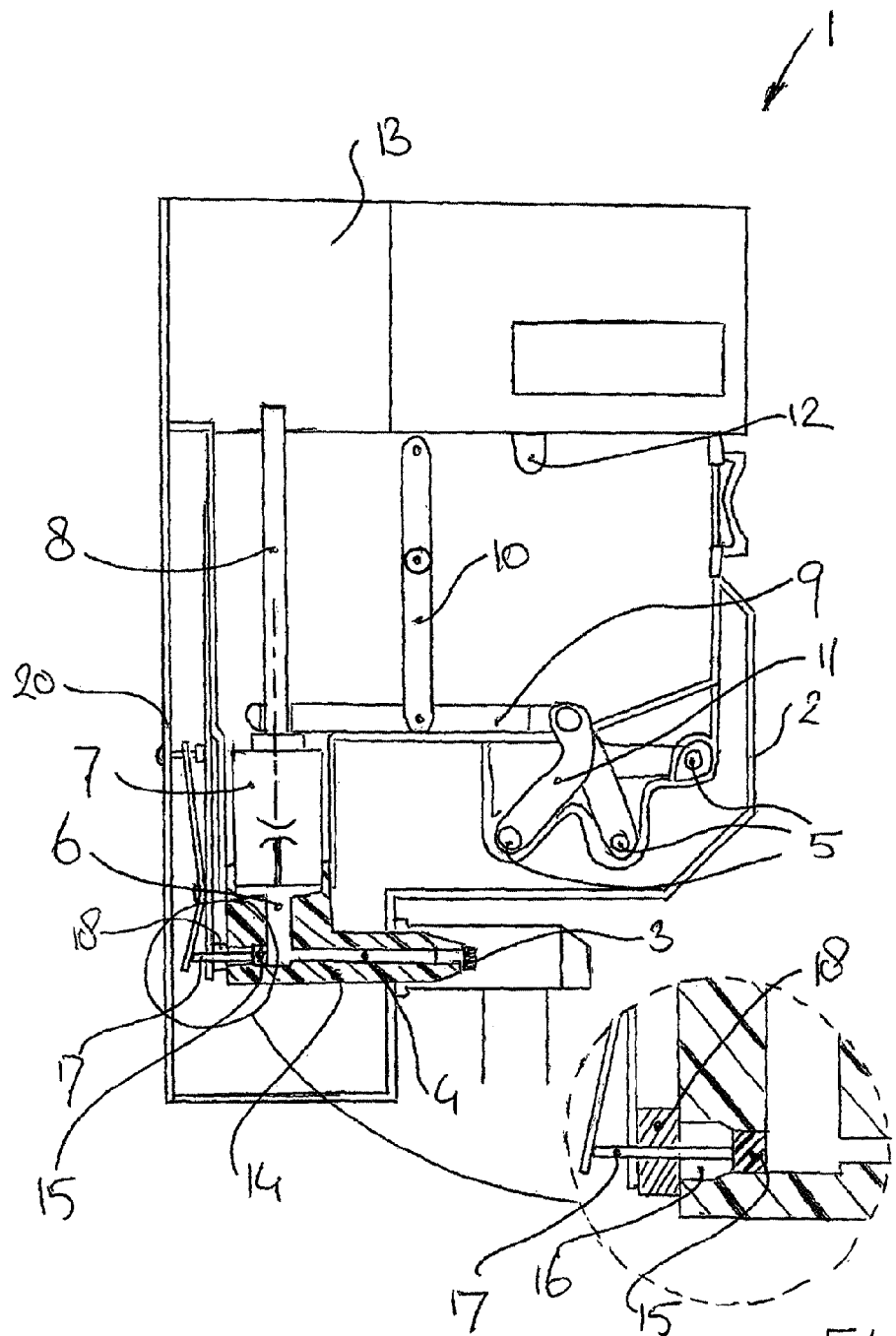
FIG. 1 shows a schematic cross sectional view of a first embodiment of a switching installation according to the invention.

Switching installations are produced in a factory, for example at sea level, where they are also air tight sealed. If such a switching installation is for example brought into the mountains, a pressure difference will be present between the gas tight sealed interior of the switching installation and outside. This pressure difference will push the housing walls outside and thus already partially move the lever of the protection means. This could cause undesired damage to the solid insulation and could even lead to a premature short circuiting, making the switching installation unusable.

Pressure differences between the ambient pressure and the pressure inside the gas tight housing could also arise due to weather changes or due to an increase of temperature inside of the housing.

With the prior art switching installation, each pressure difference between outside and the interior of the housing, will result in a movement of the lever and thus partial operation of the short-circuit device. As a result, the solid insulation can be damaged reducing the needed insulation of the input conductor.

In an embodiment, the present invention reduces or even removes the above mentioned disadvantages.

In an embodiment, a switching installation is provided which includes a threshold device for providing a preset threshold in the actuator. By providing a threshold in the actuator, some changes in pressure difference can take place, without the short-circuit device being instantly actuated. So, small variations in pressure due to weather conditions, temperature or location can be compensated by the threshold provided in the actuator. However, if an accidental arc occurs, the pressure in the housing will increase to such high levels, that the threshold will be exceeded and the short-circuit device is still actuated.

In an embodiment of the switching installation according to the invention the threshold device provides play in the actuator such that the short-circuit device is only actuated if a preset threshold is exceeded.

The play has to be compensated before the actuation of the actuator and thus a threshold has to be exceeded.

In a preferred embodiment of the switching installation according to the invention the actuator comprises a lever, which is hingedly arranged to a rigid internal frame and is coupled to the short-circuit device and the at least one wall part.

A lever provides a reliable mechanical coupling between the wall part of the housing and the short-circuit device. With a lever it is also simple to adjust the ratio of movement of the wall due to pressure difference and the movement necessary to reliably actuate the short-circuit device. With the lever it is also possible to change the direction of the movement of the wall to a direction of movement which is suitable for the short-circuit device.

In a preferred embodiment of the switching installation according to the invention the threshold is related to the movement of the wall part.

In a further preferred embodiment of the switching installation according to the invention the hinge of the lever is movably arranged to the rigid internal frame, wherein the range of movement of the hinge is set to provide the desired threshold.

When the wall of the housing moves, a force will be applied to the lever. Because the hinge of the lever has some play in this embodiment, the applied force will first result in a movement of the hinge. Only when the hinge arrives at the limits of the movement, the additional movement will be transferred to the short-circuit device for actuation. So, only when the movement of the wall is large enough, the short-circuit device will be actuated.

In still another embodiment of the switching installation according to the invention the connection of the lever with the at least one wall part is movable, wherein the range of movement is set to provide the desired threshold.

In this embodiment, the wall part can move relative to the lever to a certain extent. This takes up for the small pressure differences during normal operation of the switching installation. If the movement of the wall becomes sufficiently large, the play will not take up all movement and the lever will be displaced such that the short circuit device is operated.

Preferably, the lever is slidable over a pin arranged at the wall of the housing and a stop is arranged at the free end of the pin. The position of the stop controls the amount of play present in the actuator and thus in the lever.

In another preferred embodiment of the switching installation according to the invention the threshold is related to the speed of the pressure increase. The pressure differences resulting from weather conditions, moving the switching installation to another location or temperature changes are all building up slowly, while the pressure difference generated by an accidental arc builds up very quickly. This substantial difference in speed is used to provide play in the actuator.

Preferably, the play is provided by a cylinder with a restriction, such that the cylinder can extend and retract at a low speed. The cylinder is linked in between the moving wall and the short-circuit device. When the movements of the wall occur slowly, the cylinder will also move slowly and will follow the movements. When an accidental arc occurs, the movement of the wall part will be quick. The cylinder cannot follow this quick movement due to the restriction, such that the movement of the wall part is transferred to the short-circuit device. This functions similarly to a shock absorber cylinder.

The cylinder can be arranged between the lever and the wall part or between the rigid internal frame and the hinge.

In a further embodiment of the switching installation according to the invention, the threshold device comprises a breaking pin for restricting the movement of the wall part.

The breaking pin prevents the wall part to move due to the small pressure differences. Only when the pressure difference is large enough due to a spark, the breaking pin will break and the wall part will move, such that the short circuit device is actuated.

Preferably, the actuator comprises a lever, which is hingedly arranged to a rigid internal frame and is coupled to the short-circuit device and the at least one wall part.

In yet another embodiment of the switching installation according to the invention, wherein the threshold device is provided by a bulging in the wall part.

By providing a bulging in the wall part, the wall part is enforced. When the pressure increases inside the housing, the curved wall part will withstand the pressure and thus the wall part will not move or only minimally. Only when an accidental spark occurs, the pressure is large enough to move the bulged wall part, such that it will pop out providing a full stroke for the lever to actuate the short-circuit device. The bulging provides a high stiffness to the wall part, which can withstand pressures up to a certain threshold without virtually moving. If the threshold is exceeded, the wall part will pop out providing instantly the stroke for the lever to actuate the short-circuit device.

FIG. 1 shows a schematic cross-sectional view of an embodiment of an electrical switching installation 1 for medium or high voltage. The switching installation 1 comprises a closed gas tight housing 2 made from metal, inside which the elements of the switching installation 1 are located. The switching installation 1 is typically used to make or break an electrical connection between a power supply line 3, which is connected to a cable connection 4, and one of the rails 5 of a three-phase rail system. An input conductor 4, 6 leads from the cable connection 3 to a bottom connection of a circuit breaker 7, in the form of a vacuum circuit breaker, which is actuated by a drive rod 8. Instead of a vacuum circuit breaker a load breaker could also be used.

In the switching installation 1, the circuit breaker 7 is used to switch currents on and off. The other connection of the circuit breaker 7 is connected via a sliding electrically conductive connection, to a first side of a disconnector 9 which is actuated by a second drive rod 10. The sliding electrically conductive connection means that there is electrical contact between circuit breaker 7 and disconnector 9 irrespective of the position of the circuit breaker 7 and the disconnector 9. In the closed position, the other side of the disconnector 9 is in contact with a branch rail 11, which is connected to one of the rails 5 which extends perpendicular to the plane of the drawing.

The disconnector 9 can also electrically disconnect the conduction path between cable connection 3 and rails 5 by means of the second drive rod 10. The disconnector 9 can also be brought into contact with a ground contact 12, so that the entire electric circuit from circuit breaker 7 can be grounded.

The drive rod 8 and second drive rod 10 for the circuit breaker 7 and disconnector 9, respectively, are operated by a drive mechanism 13 which is located on the top side of the gas tight housing 2.

FIG. 1 shows a cross-sectional view which only shows one phase section of a switching installation 5. It will be clear to the person skilled in the art that the other two phase sections of the switching installation 5 are located in the direction perpendicular to the plane of the drawing, the corresponding branch rail 11 then in each case being connected to a different rail 5 of the rail system. The three phase sections together form a functional unit, also referred to as a field. Therefore, for a complete switching installation 1, a plurality of functional units can be positioned next to one another.

The cable connection or input conductor 3 is equipped with a solid insulation 14 which is used for insulation with respect to other conducting elements and the housing 2. The solid insulation 14 comprises an insulating plug 15 fitting a hole 16 in the solid insulation 14 close to the input conductor 3. In this embodiment, the insulating plug 15 is for example manufactured from rubber or any other suitable material which has electrically insulating properties but which is pierceable at the same time.

A thin, metal driving peg 17 is located in front of the insulating plug 15. The driving peg 17 is guided by a metal plug 18, also fitted in the hole in the solid insulation 14. In the shown example, the metal plug 18 is grounded. Alternatively, the metal plug 18 is not grounded itself but provides, when the driving peg 17 is actuated as described below, an electrical contact to the enclosure 2. The insulating plug 15, the driving peg 17, and possibly the metal plug 18 together form a short-circuit device.

The enclosure 2 further comprises an actuator having a mechanical lever 19 with the enclosure 30. (see also FIG. 2). The mechanical lever 19 connects a wall part 20 of the housing 2 to the driving peg 17. The lever 19 is connected to a rigid internal frame 21 via a hinge 22. One free end 23 of the lever 19 is in contact with the driving peg 17. The other free end 24 is provided with an opening 25, through which a rod 26 extends, which is fixed to the wall part 20. A stop 27 is provided at the free end of the rod 26 to prevent the lever 19 from sliding of the rod 26.

Figure 2:
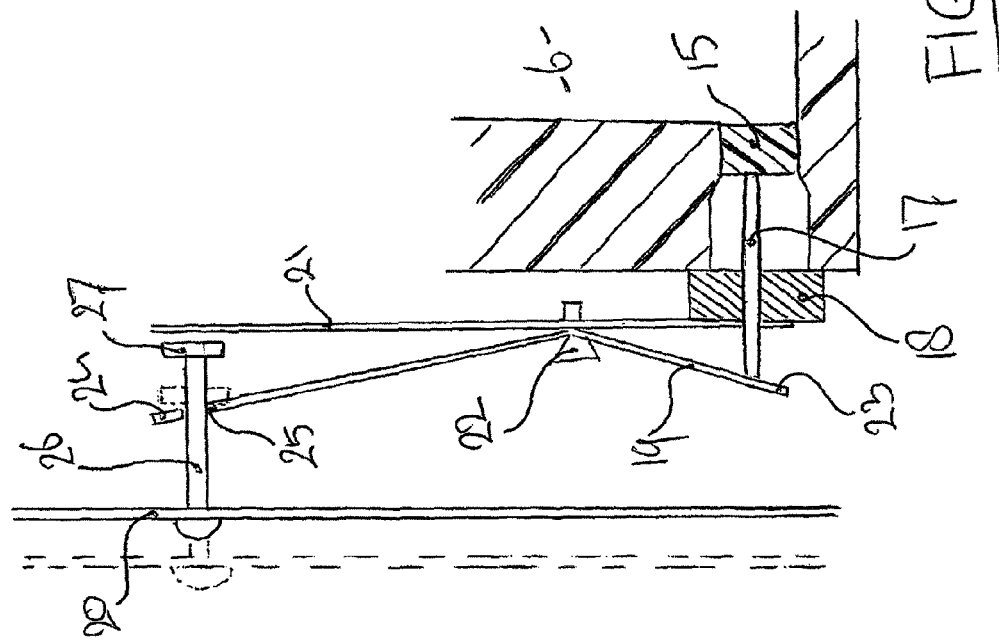
FIG. 2 shows a detail of the embodiment of FIG. 1.

As depicted in FIG. 2 with a dotted line, the wall part 20 can move away by a pressure increase in the housing 2, while the lever 19 remains in a rest position. This enables small pressure increases due to weather changes and temperature changes, while the short-circuit device is not actuated at all. Only if the movement of the wall part 20 is sufficiently large, the driving peg 17 will be pushed into the insulation plug 15 to contact the input conductor 6 to provide a short circuit and prevent further arcing.

Figure 3:
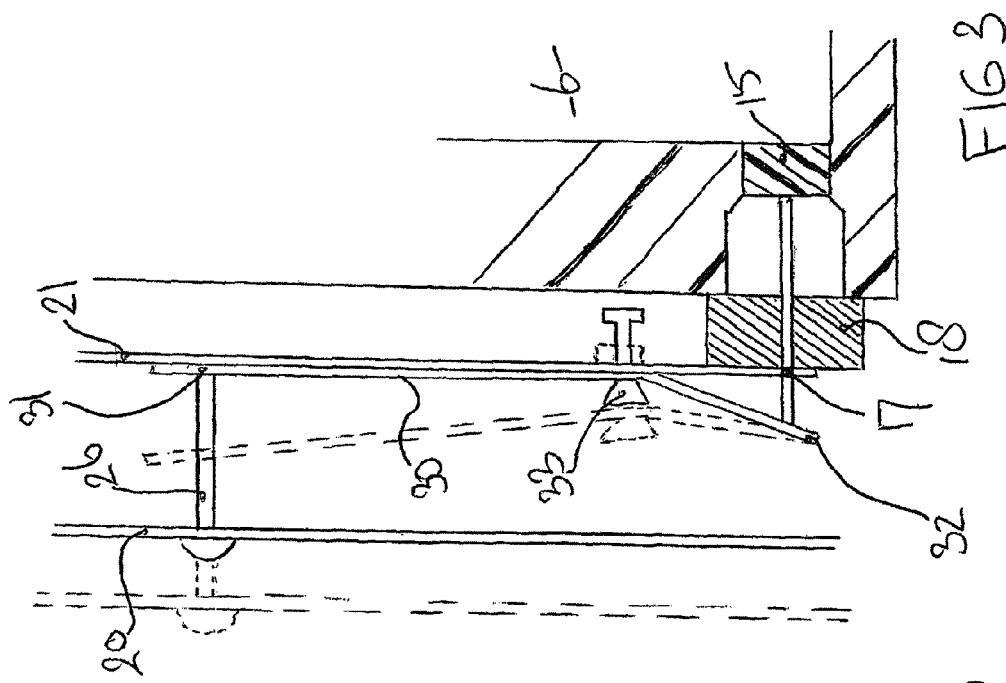
FIG. 3 shows a second embodiment of the invention.

FIG. 3 shows a second embodiment of a switching installation according to the invention. This second embodiment corresponds partially with the first embodiment and similar features are designated with the same reference signs.

A lever 30 is provided, which is fixed with one end 31 to the rod 26. The other end 32 of the lever 30 is connected to the driving peg 17.

The lever 30 is connected at the middle through a hinge 33 with an internal frame 21. The hinge 33 is slidably arranged in the internal frame 21.

When the wall part 20 moves away, the lever 30 will tilt around the bottom free end 32 sliding the hinge 33 out of the internal frame 21. (shown in dotted lines)

Only when the movement of the wall part 20 is large enough, the sliding movement of the hinge 33 will reach its limit causing the further movement to push the driving peg 17 into the insulation plug 15.

Figure 4:
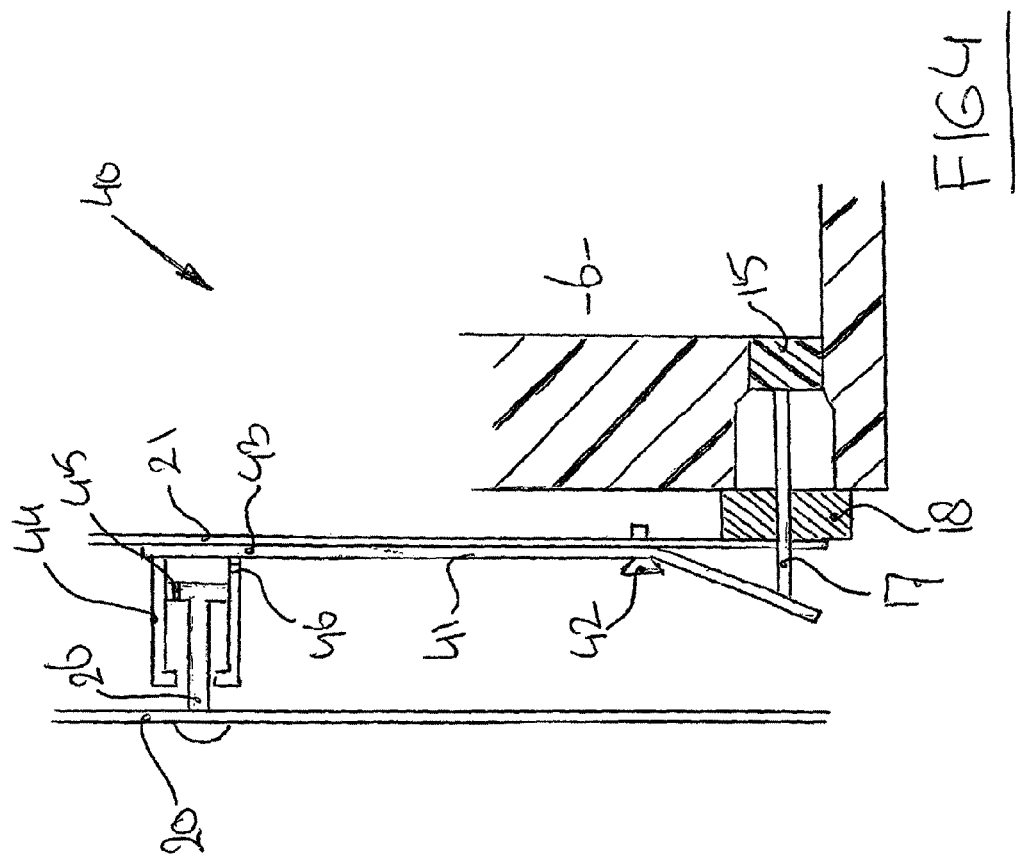
FIG. 4 shows a third embodiment of the invention.

FIG. 4 shows a third embodiment of a switching installation 40. Features corresponding with the earlier embodiments are designated with the same reference signs.

A lever 41 is fixed through a hinge 42 to the internal frame 21. At the free end 43 of the lever 41 a cylinder 44 is arranged, which is connected to the rod 26 attached to the wall part 20. Restrictions 45, 46 are arranged in the cylinder 44, such that the cylinder 44 can retract and extend slowly, such that the slow movements of the wall part 20 can be followed. Quick movements as result of accidental arcs will not be followed due to the small restrictions, such that at such moments the lever 41 and thus the driving peg 17 is operated.

Figure 5:
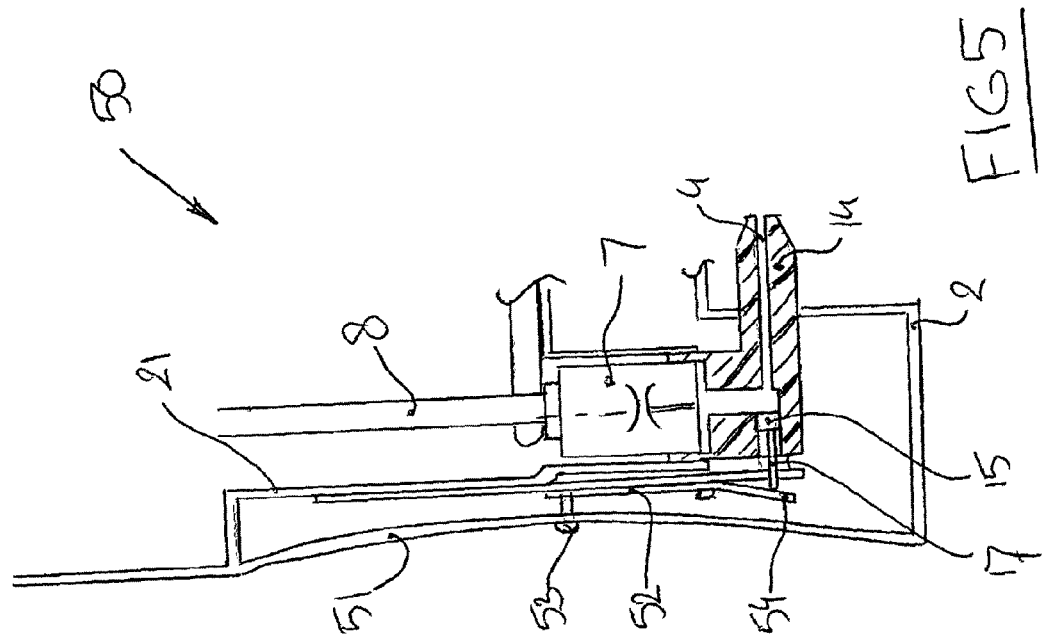
FIG. 5 shows a schematic view of a fourth embodiment of the invention.

FIG. 5 shows a fourth embodiment of a switching installation 50 according to the invention. Features corresponding with the earlier embodiments are designated with the same reference signs.

In this embodiment, the wall part 51 is provided with an inward directed bulging. A lever 52 is connected to this bulged wall part 51 at connection point 53. The other free end 54 of the lever 52 is arranged to the driving peg 17.

By providing a bulging in the wall part 51, the wall part 51 is enforced. When a small pressure difference is present over the wall part 51, the curved wall part will withstand the pressure and thus the wall part will not move or only minimally.

If the pressure difference is large enough, the wall part 51 will pop out and ensure that the lever 52 fully drives the driving peg 17 through the insulation plug 15. The bulging provides a high stiffness to the wall part 51, such that it can withstand pressures up to a certain threshold without virtually moving. If the threshold is exceeded, the wall part will pop out providing instantly the stroke for the lever 52 to actuate the driving peg 17.

FIGS. 6A and 6B show a fifth embodiment of a switching installation 60 according to the invention. Features corresponding with the earlier embodiments are designated with the same reference signs.

In this embodiment 60, the wall part 20 is directly connected to the driving peg 17 via the rod 26 and lever 61. The lever 61 is hingedly arranged via fixed hinge 62 to the internal frame 21.

To ensure that the driving peg 17 is not instantly actuated with each pressure difference, a breaking pin 63 is provided between the wall part 20 and the internal pin 21. As long the break part 64 of the breaking pin 63 can withstand the pressure difference over the wall part 20, the lever 61 will not move (see FIG. 6A). So for small pressure differences no movement will occur at all. When the pressure difference is large enough, the break part 64 will break and the wall part 20 is allowed to move, actuating the driving peg 17 through the lever 61 (see FIG. 6B).

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A switching installation comprising:
a gas tight housing with at least one wall part;
an input conductor disposed in the housing and configured to carry an input voltage;
an insulation arranged around the input conductor so as to insulate the input conductor from the housing;
a short-circuit device changeable from a first condition, in which the insulation is insulating the input conductor from the housing, to a second condition, in which an electrical short circuit connection is created through the insulation between the input conductor and an auxiliary connection;
an actuator coupled to the at least one wall part of the gas tight housing and configured to actuate the short-circuit device as a result of movement of the wall part caused by a pressure increase in the housing; and
a threshold device configured to provide a preset threshold in the actuator.

2. The switching installation according to claim 1, wherein the threshold device provides play in the actuator such that the short-circuit device is only actuated if the threshold is exceeded.

3. The switching installation according to claim 1, wherein the actuator comprises a lever which is connected by a hinge to a rigid internal frame and is coupled to the short-circuit device and the at least one wall part.

4. The switching installation according to claim 3, wherein the threshold is related to the movement of the at least one wall part.

5. The switching installation according to claim 4, wherein the hinge of the lever is movably arranged to the rigid internal frame, wherein a range of movement of the hinge provides the threshold.

6. The switching installation according to claim 4, wherein the connection of the lever with the at least one wall part is movable, wherein a range of movement of the hinge provides the threshold.

7. The switching installation according to claim 6, wherein the lever is slidable over a pin arranged at the at least one wall part and wherein a stop is arranged at a free end of the pin.

8. The switching installation according to claim 3, wherein the threshold is related to a speed of the pressure increase.

9. The switching installation according to claim 8, wherein the threshold device includes a cylinder with a restriction, such that the cylinder is extendable and retractable at a low speed, the cylinder providing play in the actuator such that the short-circuit device is only actuated if the threshold is exceeded.

10. The switching installation according to claim 9, wherein the cylinder is arranged between the lever and the at least one wall part or between the rigid internal frame and the hinge.

11. The switching installation according to claim 1, wherein the threshold device includes a breaking pin for disposed so as to restrict the movement of the at least one wall part.

12. The switching installation according to claim 11, wherein the actuator comprises a lever which is connected by a hinge to a rigid internal frame and is coupled to the short-circuit device and the at least one wall part.

13. The switching installation according to claim 1, wherein the threshold device includes a bulging in the at least one wall part.

14. The switching installation according to claim 13, wherein the actuator comprises a lever which is connected by a hinge to a rigid internal frame and is coupled to the short-circuit device and the at least one wall part.

* * * * *